United States Patent
Kim et al.

(10) Patent No.: US 7,129,777 B2
(45) Date of Patent: Oct. 31, 2006

(54) DIGITAL FEEDBACK LINEARIZING APPARATUS TO LINEARIZE POWER AMPLIFIER AND METHOD USED BY THE APPARATUS

(75) Inventors: Bumman Kim, Pohang (KR); Jae Hyok Yi, Pohang (KR); Young Yun Woo, Pohang (KR)

(73) Assignee: POSTECH Foundation, Pohang (KR)

( * ) Notice: Subject to any disclaimer, the term of this patent is extended or adjusted under 35 U.S.C. 154(b) by 113 days.

(21) Appl. No.: 10/807,342

(22) Filed: Mar. 24, 2004

(65) Prior Publication Data

US 2005/0077960 A1   Apr. 14, 2005

(30) Foreign Application Priority Data

Oct. 10, 2003   (KR) .................. 10-2003-0070639

(51) Int. Cl.
  *H03F 1/26* (2006.01)
(52) U.S. Cl. .................................................. 330/149
(58) Field of Classification Search ............ None
  See application file for complete search history.

(56) References Cited

U.S. PATENT DOCUMENTS

| | | | | |
|---|---|---|---|---|
| 5,049,832 | A * | 9/1991 | Cavers ................. | 330/149 |
| 5,745,006 | A * | 4/1998 | Budnik et al. ........... | 330/149 |
| 5,770,971 | A * | 6/1998 | McNicol ............... | 330/52 |
| 6,246,286 | B1 | 6/2001 | Persson | |
| 6,314,142 | B1 | 11/2001 | Perthold et al. | |
| 6,703,897 | B1 * | 3/2004 | O'Flaherty et al. ....... | 330/149 |
| 6,756,845 | B1 * | 6/2004 | Mashhour .............. | 330/149 |
| 7,023,273 | B1 * | 4/2006 | Johnson et al. ......... | 330/149 |
| 2002/0018531 | A1 | 2/2002 | Ratto | |
| 2002/0136324 | A1 | 9/2002 | Nagasaka | |
| 2002/0191710 | A1 | 12/2002 | Jeckeln et al. | |
| 2003/0058959 | A1 * | 3/2003 | Rafie et al. ............. | 375/296 |

FOREIGN PATENT DOCUMENTS

| | | |
|---|---|---|
| EP | 1199814 A1 | 4/2002 |
| GB | 2 385 730 A | 8/2003 |
| JP | 1998-086858 | 12/1998 |
| JP | 2002-038682 | 5/2002 |

OTHER PUBLICATIONS

Jae-Hee Han et al., "*Adaptive Predistorter For Power Amplifier Based On Real-Time Estimation Of Envelope Transfer Characteristics,*" Electronic Letters, Dec. 9, 1999, pp. 2167-2168, vol. 35(25), XP006013057.

W.J. Jung et al., "*Digital Predistorter Using Mulitple Lookup Tables,*" Electronic Letters, Sep. 18, 2003, pp. 1386-1387, vol. 39(19), XP006020986.

(Continued)

*Primary Examiner*—Robert Pascal
*Assistant Examiner*—Krista M. Flanagan
(74) *Attorney, Agent, or Firm*—Rothwell, Figg, Ernst & Manbeck

(57) ABSTRACT

Provided is a digital feedback linearizing apparatus and method to linearize a power amplifier (PA), which is intended to improve the linearity of a mobile communication base station PA, and more particularly, a digital feedback linearizing apparatus and method to linearize a PA using a digital signal process (DSP) and a feedback technology, in which a predistorted signal required for linearization is generated by adding an input signal input through a predetermined path to an inverse distortion component corresponding to a distortion component of an PA and in which a linearly amplified output signal is obtained by passing the predistorted signal through the PA.

10 Claims, 7 Drawing Sheets

OTHER PUBLICATIONS

Conradi, C. P. et al., "Predistorted LINC Transmitter," Electronic Letters, IEE Stevenage, GB, vol. 38, No. 7, Mar. 28, 2002, pp. 301-302, XP006017963.

Chinese Office Action with partial English translation, issued Dec. 16, 2005 in the corresponding Chinese Application 200410032825.8.

* cited by examiner

DIGITAL FEEDBACK LINEARIZING APPARATUS TO LINEARIZE POWER AMPLIFIER AND METHOD USED BY THE APPARATUS

CROSS REFERENCE TO RELATED APPLICATION

This application claims the priority of Korean Patent Application No. 2003-70639, filed on Oct. 10, 2003, in the Korean Intellectual Property Office, the disclosure of which is herein in its entirety incorporated by reference.

BACKGROUND OF THE INVENTION

1. Field of the Invention

The present invention relates to a digital feedback linearizing apparatus and method to linearize a power amplifier (PA) to improve the linearity of a mobile communication base station PA, and more particularly, to a digital feedback linearizing apparatus and method to linearize a PA using a digital signal process (DSP) and a feedback technology, in which a predistorted signal required for linearization is generated by adding an input signal input through a predetermined path to an inverse distortion component corresponding to a distortion component of a PA and in which a linearly amplified output signal is obtained by passing the predistorted signal through the PA, so that linearity of the PA is effectively improved.

Also, the present invention relates to a digital feedback linearizing apparatus and method, which generates the optimal predistorted signal for an input signal by obtaining an inverse distortion component corresponding to the amplitude of the input signal from a previously formed and stored lookup table.

2. Description of the Related Art

As is well known to those skilled in the art, mobile base station power amplifiers preferably output high power signals without distortion. In particular, since a wideband code division multiple access (WCDMA) technology adopts multi-carrier (MC) transmission, standards for linearity become increasingly important. To ensure superior linearity, various linearizing techniques and apparatuses adopting such techniques such as analog predistorters, analog feedback linearizers, feedforward linearizers, and digital predistorters have been used.

Among such linearizing apparatuses, analog predistorters and analog feedback linearizers have narrowband frequency characteristics and have trouble in linearizing input signals to target values. Feedforward linearizers have been most commonly used so far and have superior linearizing characteristics, but have problems such as low cost-competitiveness, high heat emission, and large size.

To solve the above problems, digital predistorters have been developed, which use digital signal processing, have a wide frequency band, show superior linearity improvement, have high cost- and size-competitiveness, and are very suitable for base station linearizers. However, if the digital predistorters themselves have many errors, error tolerance of PAs in which they are used is not large. As a result, it is difficult to cancel distortion of the PAs as desired by standards.

A conventional analog feedback predistorter used as a linearizer for a PA which is shown in FIG. 1, can efficiently extract predistorted signals, has very large error tolerance in cancellation of distorted signals. Referring to FIG. 1, the conventional analog feedback predistorter comprises a feeding block 2, a canceling block 4, a main amplifier block 6, and vector modulators (VM) 3 and 5. In the canceling block 4, an input signal u(t) of a main PA 10 is cancelled from an output signal y(t) of the main PA 10 and an inverse distortion component e(t) is extracted. In the feeding block 2, the inverse distortion component e(t) is added to an input signal x(t) through a feedback loop. In FIG. 1, the vector modulators 3 and 5 properly modulate the phases of respective input signals.

A frequency domain signal Y(f) of the output signal y(t) output from the conventional analog feedback predistorter of FIG. 1 is expressed as follows.

$$Y = \frac{X}{(1-Gu)/Gm - Gy} + \frac{(1-Gu) \cdot Xd}{1 - Gu - Gy \cdot Gm} \quad (1.a)$$

$$Y \approx \frac{X}{Gy} - \frac{(1-Gu) \cdot Xd}{Gy \cdot Gm}, \quad (1.b)$$

where Gm, Gu, and Gy respectively denote a gain of each path shown in FIG. 1, X denotes an input signal of a frequency domain, and Xd denotes an intermodulation (IM) signal generated by the main PA 10.

The first term of Equation 1.a indicates an amplified main signal and the second term indicates a cancelled IM signal. To completely cancel the IM signal, the second term should be made to approximate 0. To this end, it is desirable to set Gu to 1. Assuming that Gu approximates 1, Equation (1.a) can be expressed as approximation Equation (1.b) that clearly shows a feedback operation. The total gain $G_{PD}$ of the analog feedback predistorter is determined by the gain of a feedback loop and is equal to $-1/Gy$. An IM component is divided by the gain Gy·Gm ($\geq 1$) of a closed loop due to a negative feedback operation. If the analog feedback predistorter of FIG. 1 is designed so that Gy·Gm is much greater than 1, cancellation of the distortion component is maximized and distortion cancellation error tolerance increases.

However, due to feedback characteristics, the conventional analog feedback distorter has a narrow operating band and operates unstably, resulting in a high possibility of oscillation.

SUMMARY OF THE INVENTION

The present invention provides a digital feedback linearizing apparatus and method to linearize a PA using a digital signal process (DSP) and a feedback technology, in which a predistorted signal required for linearization is generated by adding an input signal input through a predetermined path to an inverse distortion component corresponding to a distortion component of a PA and in which a linearly amplified output signal is obtained by passing the predistorted signal through the PA, so that linearity of the PA is effectively improved.

The present invention also provides a digital feedback linearizing apparatus and method, which generates the optimal predistorted signal for an input signal by obtaining an inverse distortion component corresponding to the amplitude of the input signal from a previously formed and stored lookup table.

According to one aspect of the present invention, there is provided a digital feedback linearizing apparatus to linearize a power amplifier used in a mobile communication base station, the digital feedback linearizing apparatus comprising a power amplifier input/output signal subtracting means, an inverse distorted feedback signal extracting means, and a signal adding means. The power amplifier input/output signal subtracting means generates a difference between an input signal and an output signal of the power amplifier. The inverse distorted feedback signal extracting means extracts an inverse distorted feedback signal (e(t)) corresponding to an input signal (x(t)) input to the digital feedback linearizing apparatus through a predetermined path based on the output signal of the power amplifier input/output signal subtracting means and the input signal (x(t)). The signal adding means generates a predistorted signal (u(t)) input to the power amplifier by adding the inverse distorted feedback signal (e(t)) to the input signal (x(t)). The power amplifier linearizes the power amplifier using the predistorted signal (u(t)) as its input signal.

Preferably, the inverse distorted feedback signal extracting means comprises a look-up table composed of signal values that are quantized corresponding to the amplitude of the input signal (x(t)), which gradually increases by a predetermined unit.

According to another aspect of the present invention, there is provided a digital feedback linearizing apparatus to linearize a power amplifier used in a mobile communication base station, the digital feedback linearizing apparatus comprising a look-up table, a feedback output reference signal selecting means, and a signal adding means. The look-up table is composed of signal values that are quantized corresponding to the amplitude of the absolute value of an input signal (x(t)) input to the digital feedback linearizing apparatus. The feedback output reference signal selecting means selects a feedback output reference signal ($y_r(t)$) relating to an output signal fed back from the power amplifier from the look-up table. The signal adding means generates an error signal ($x_e(t)$) input to the power amplifier by adding the feedback output reference signal ($y_r(t)$) to the input signal (x(t)). The power amplifier linearizes the power amplifier using the error signal ($x_e(t)$) as its input signal.

Preferably, when the gain of the power amplifier is A, a distortion component caused by the power amplifier is d(t), a degree of offset caused by feedback is 1/K, and the output signal of the power amplifier is y(t), the following equation is established:

$$y(t) = A \cdot x_e(t) + d(t)$$
$$y_r(t) = \frac{y(t)}{K}$$
$$x_e(t) = x(t) - y_r(t).$$

According to still another aspect of the present invention, there is provided a digital feedback linearizing method implemented by a linearizing apparatus to linearize a power amplifier used in a mobile communication base station. The digital feedback linearizing method comprises (a) generating a difference between an input signal and an output signal of the power amplifier, (b) extracting an inverse distorted feedback signal (e(t)) based on the difference generated in step (a) and an absolute value of an input signal (x(t)) input to the linearizing apparatus through a predetermined path, (c) generating a predistorted signal (u(t)) input to the power amplifier by adding the inverse distorted feedback signal (e(t)) to the input signal (x(t)), and (d) linearizing the power amplifier using the predistorted signal (u(t)) as an input signal of the power amplifier.

Preferably, step (b) comprises structuring the look-up table composed of signal values that are quantized corresponding to the amplitude of the input signal (x(t)), which gradually increases by a predetermined unit, and extracting the inverse distorted feedback signal (e(t)) from the look-up table.

According to yet another aspect of the present invention, there is provided a digital feedback linearizing method implemented by a linearizing apparatus to linearize a power amplifier used in a mobile communication base station. The digital feedback linearizing method comprises structuring a look-up table composed of signal values quantized corresponding to the amplitude of an absolute value of an input signal (x(t)) input to the linearizing apparatus, selecting a feedback output reference signal ($y_r(t)$) relating to an output signal fed back from the power amplifier from the look-up table, generating an error signal ($x_e(t)$) input to the power amplifier by adding the feedback output reference signal ($y_r(t)$) to the input signal (x(t)), and linearizing the power amplifier by using the error signal ($x_e(t)$) as an input signal of the power amplifier.

BRIEF DESCRIPTION OF THE DRAWINGS

The above and other aspects and advantages of the present invention will become more apparent by describing in detail an exemplary embodiment thereof with reference to the attached drawings in which.

DETAILED DESCRIPTION OF THE INVENTION

Figure 1:
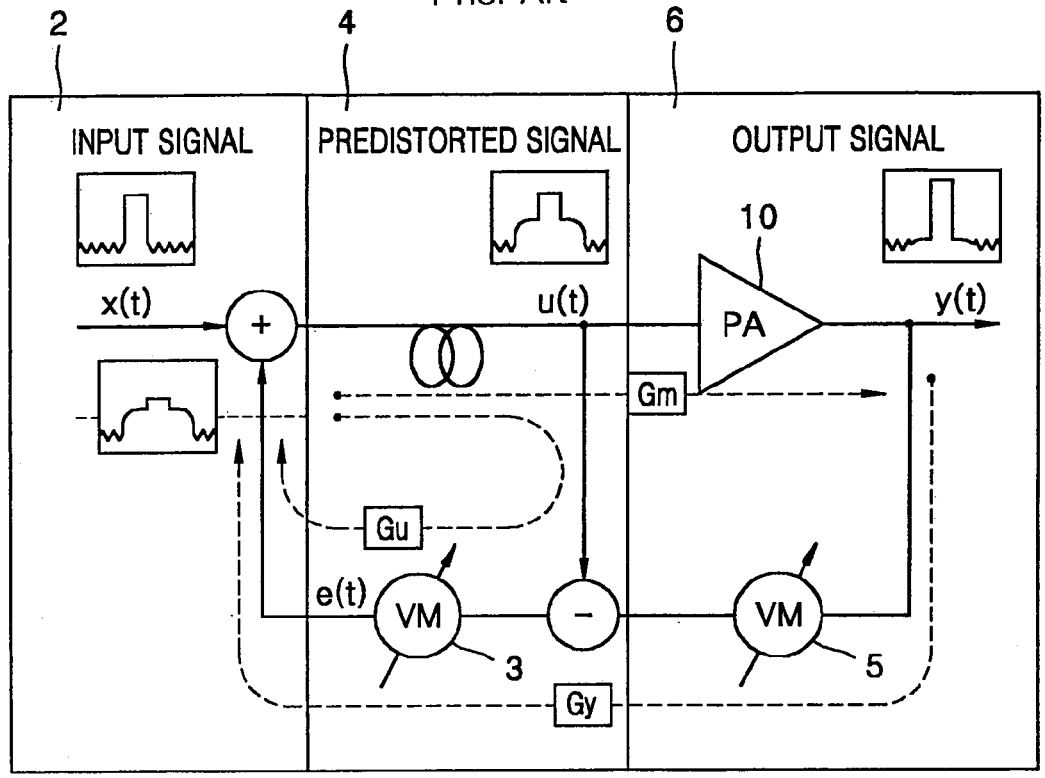
FIG. 1 illustrates a conventional analog feedback predistorter used as a linearizer to linearize a PA.

The present invention will now be described more fully with reference to the accompanying drawings, in which embodiments of the invention are shown. Throughout the drawings, like reference numerals are used to refer to like elements.

Figure 2:
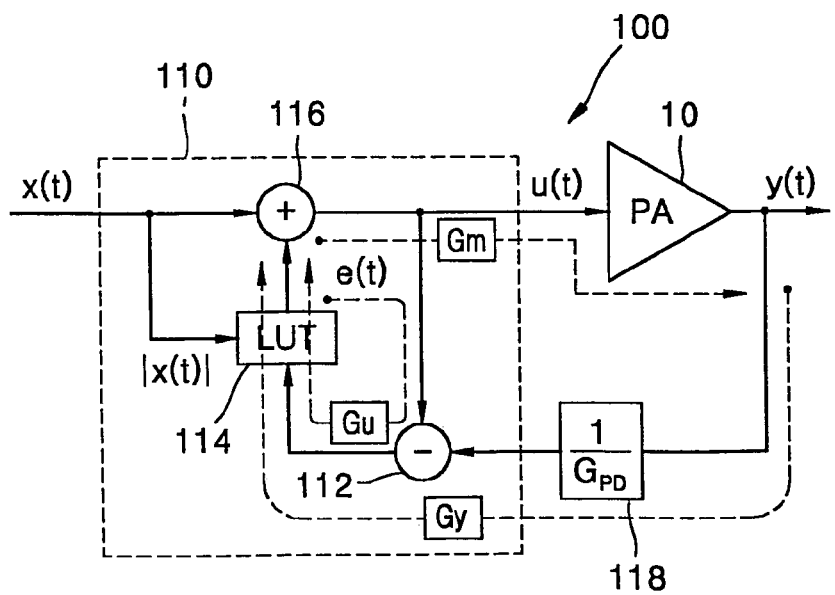
FIG. 2 illustrates a digital feedback linearizing apparatus to linearize a PA according to a first embodiment of the present invention.

Referring to FIG. 2, a digital feedback linearizing apparatus 100 according to a first embodiment of the present invention comprises a PA input/output signal subtracting unit 112 that generates a difference between an input signal and an output signal of a PA 10; a look-up table 114 used as an inverse distortion feedback signal extracting unit that extracts an inverse distorted feedback signal e(t) corresponding to an input signal x(t) based on an output signal of the PA input/output signal subtracting unit 112 and an absolute value of the input signal x(t) input to the digital feedback linearizing apparatus 100 via a predetermined path; a signal adding unit 116 that generates a predistorted signal u(t) input to the PA 10 by adding the inverse distorted feedback signal e(t) to the input signal x(t); and an output signal offset unit 118 that is interposed between an output terminal of the PA 10 and the input/output signal subtracting unit 112 and offsets the amplitude of the output signal y(t) of the PA 10 by the reciprocal of the total gain GPD. The digital feedback linearizing apparatus 100 using the predistorted signal u(t) as its input signal.

As shown in FIG. 2, the input/output signal subtracting unit 112, the look-up table 114 used as the inverse distorted feedback signal extracting unit, and the signal adding unit 116 of the present invention may be included in a digital signal processor (DSP) 110. The look-up table 114 used as the inverse distorted feedback signal extracting unit comprises signal values that are quantized corresponding to the amplitude of the input signal x(t), which gradually increases by a predetermined unit, e.g., 1. The digital feedback linearizing apparatus 100 has a gain Gu that approximates 1. The gain Gu results when the predistorted signal u(t) is fed back and added to the input signal x(t) as shown in FIG. 2.

Figure 4:
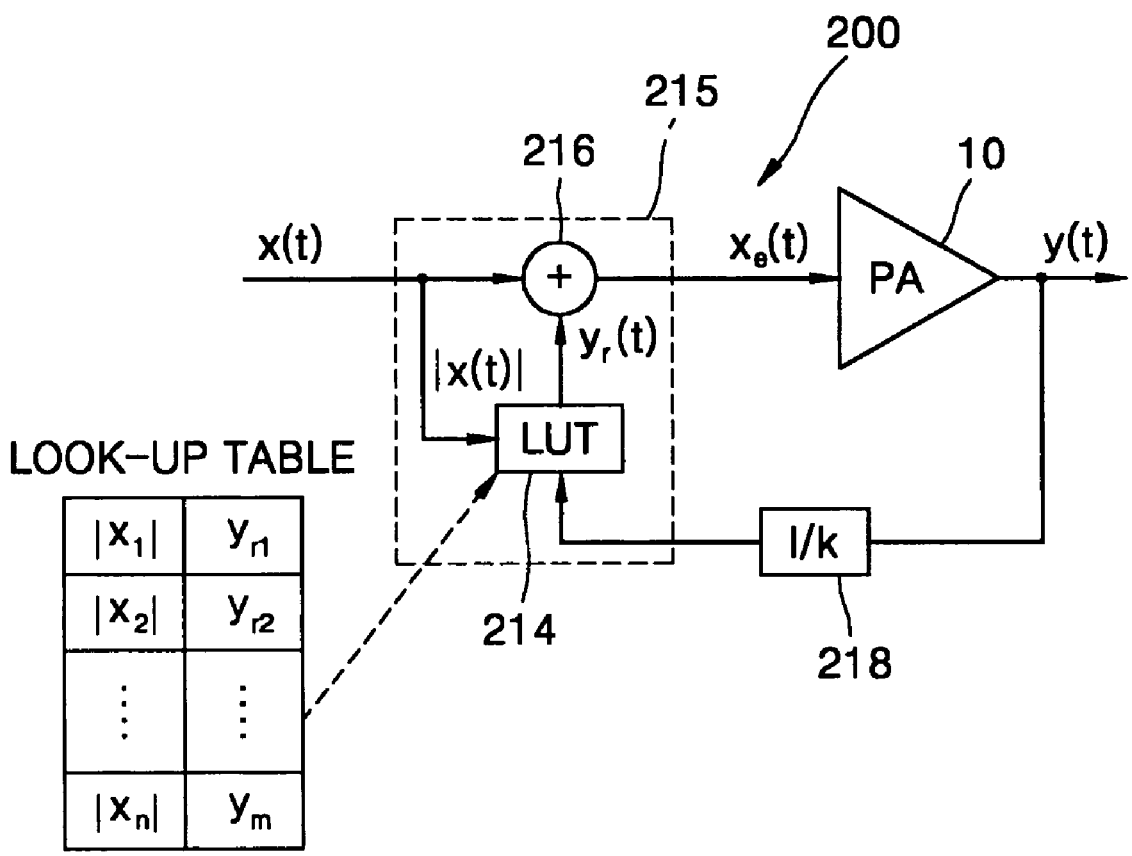
FIG. 4 illustrates a digital feedback linearizing apparatus to linearize a PA according to a second embodiment of the present invention.

Referring to FIG. 4, a digital feedback linearizing apparatus 200 according to a second embodiment of the present invention comprises a look-up table 214 that is composed of signal values quantized corresponding to the absolute value of an input signal x(t) input to the digital feedback linearizing apparatus 200; a feedback output reference signal selecting unit 215 that selects a feedback output reference signal $y_r(t)$ relating to an output signal fed back from the PA 10 from the look-up table 214; a signal adding unit 216 that generates an error signal $x_e(t)$ input to the PA 10 by adding the feedback output reference signal $y_r(t)$ to the input signal x(t); and an output signal offset unit 218 that offsets the amplitude of an output signal of the PA 10 by the reciprocal of the total gain K of the digital feedback linearizing apparatus 200. The digital feedback linearizing apparatus 200 linearizes the PA 10 using the error signal $x_e(t)$ as the input signal.

In the embodiment of the present invention shown in FIG. 4, let a gain of the PA 10 be A, a distortion component caused by the PA 10 be d(t), a degree of offset caused by feedback be 1/K, and the output signal of the PA 10 be y(t). Then the following equations are established.

$$y(t) = A \cdot x_e(t) + d(t) \quad (2)$$

$$y_r(t) = \frac{y(t)}{K} \quad (3)$$

$$x_e(t) = x(t) - y_r(t) \quad (4)$$

$$y(t) = \frac{K(Ax(t) + d(t))}{K + A} \quad (5)$$

$$y(t) = Kx(t) + \frac{Kd(t)}{A} \quad (6)$$

Equation 6 is obtained by assuming that A>>K in Equation 5.

Figure 3:
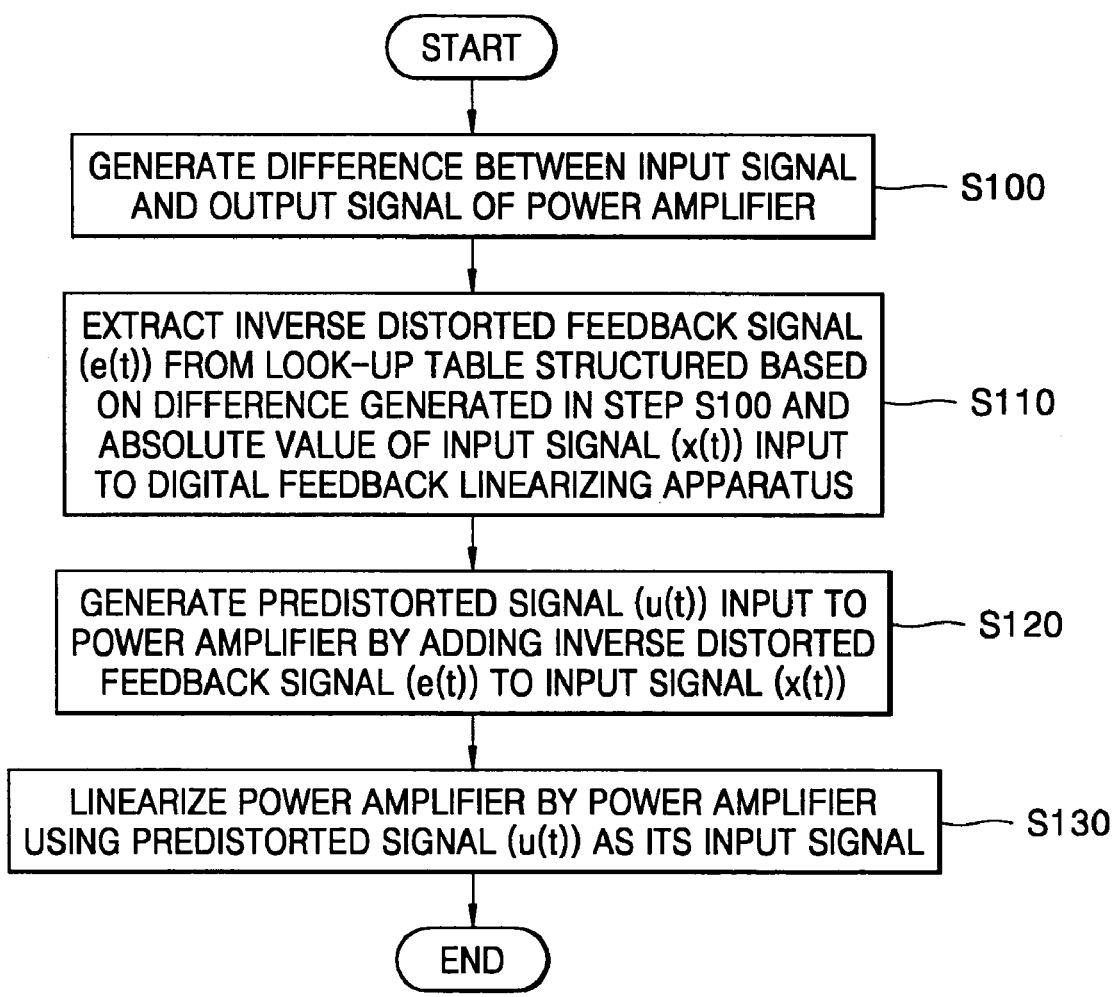
FIG. 3 is a flowchart illustrating a digital feedback linearizing method implemented by the digital feedback linearizing apparatus of FIG. 2 according to the first embodiment of the present invention.

FIG. 3 is a flowchart illustrating a digital feedback linearizing method implemented by the digital feedback linearizing apparatus 100 of FIG. 2 according to the first embodiment of the present invention. Referring to FIG. 3, the digital feedback linearizing method of the present invention comprises generating a difference D between an input signal and an output signal of the PA 10 (S100), extracting the inverse distorted feedback signal e(t) from the look-up table 114, which is structured based on the difference D generated in step S100 and the absolute value of the input signal x(t) input to the digital feedback linearizing apparatus 100 (S110); generating the predistorted signal u(t) input to the PA 10 by adding the inverse distorted feedback signal e(t) to the input signal x(t) (S120); and linearizing the PA 10 by the PA 10 using the predistorted signal u(t) as its input signal (S130).

Figure 5:
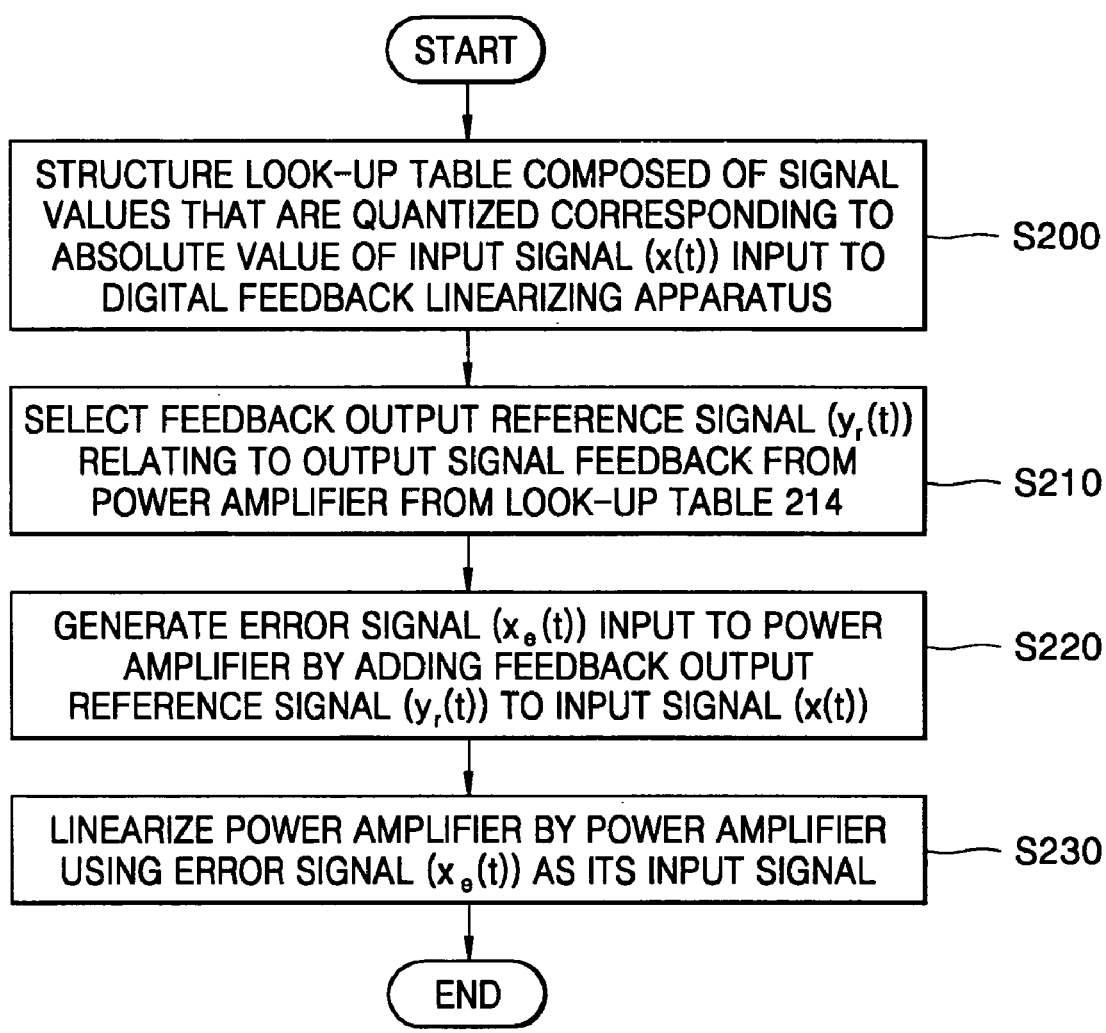
FIG. 5 is a flowchart illustrating a digital feedback linearizing method implemented by the digital feedback linearizing apparatus of FIG. 4 according to the second embodiment of the present invention.

FIG. 5 is a flowchart illustrating a digital feedback linearizing method implemented by the digital feedback linearizing apparatus 200 of FIG. 4 according to the second embodiment of the present invention. Referring to FIG. 5, the digital feedback linearizing method comprises structuring the look-up table 214 composed of signal values quantized corresponding to the absolute value of the input signal x(t) input to the digital feedback linearizing apparatus 200 (S200); selecting the feedback output reference signal $y_r(t)$ relating to the output signal fed back from the PA 10 from the look-up table 214 (S210); generating the error signal $x_e(t)$ input to the PA by adding the feedback output reference signal $y_r(t)$ to the input signal x(t) (S220); and linearizing the PA 10 by the PA 10 using the error signal $x_e(t)$ as its input signal (S230).

Operations of the digital feedback linearizing apparatuses 100 and 200 according to the embodiments of the present invention will be described with reference to FIGS. 2 through 8.

The operating principle of the digital feedback linearizing apparatus 100 to linearize the PA 10 is similar to, but different from, that of the analog feedback predistorter described with reference to FIG. 1 in that the inverse distorted feedback signal e(t) is included in the look-up table 114. Also, the gain Gu of an offset path of prior art and the gain Gy of a feedback path are controlled by the DSP 110 in the present invention.

The use of the look-up table 114 makes it possible to enlarge the operation range of the PA 10 and removes a possibility of oscillation of the PA 10. Thus, the digital feedback linearizing apparatus 100 to linearize the PA 10 according to the first embodiment of the present invention has the same advantages as those of conventional digital predistorters, such as superior linearity, low price, size competitiveness, compatibility with base station digital parts, wide operating band, stability, and the like and, has a high distortion offset error allowance, which is a superior advantage of conventional analog predistorters.

Figure 6:
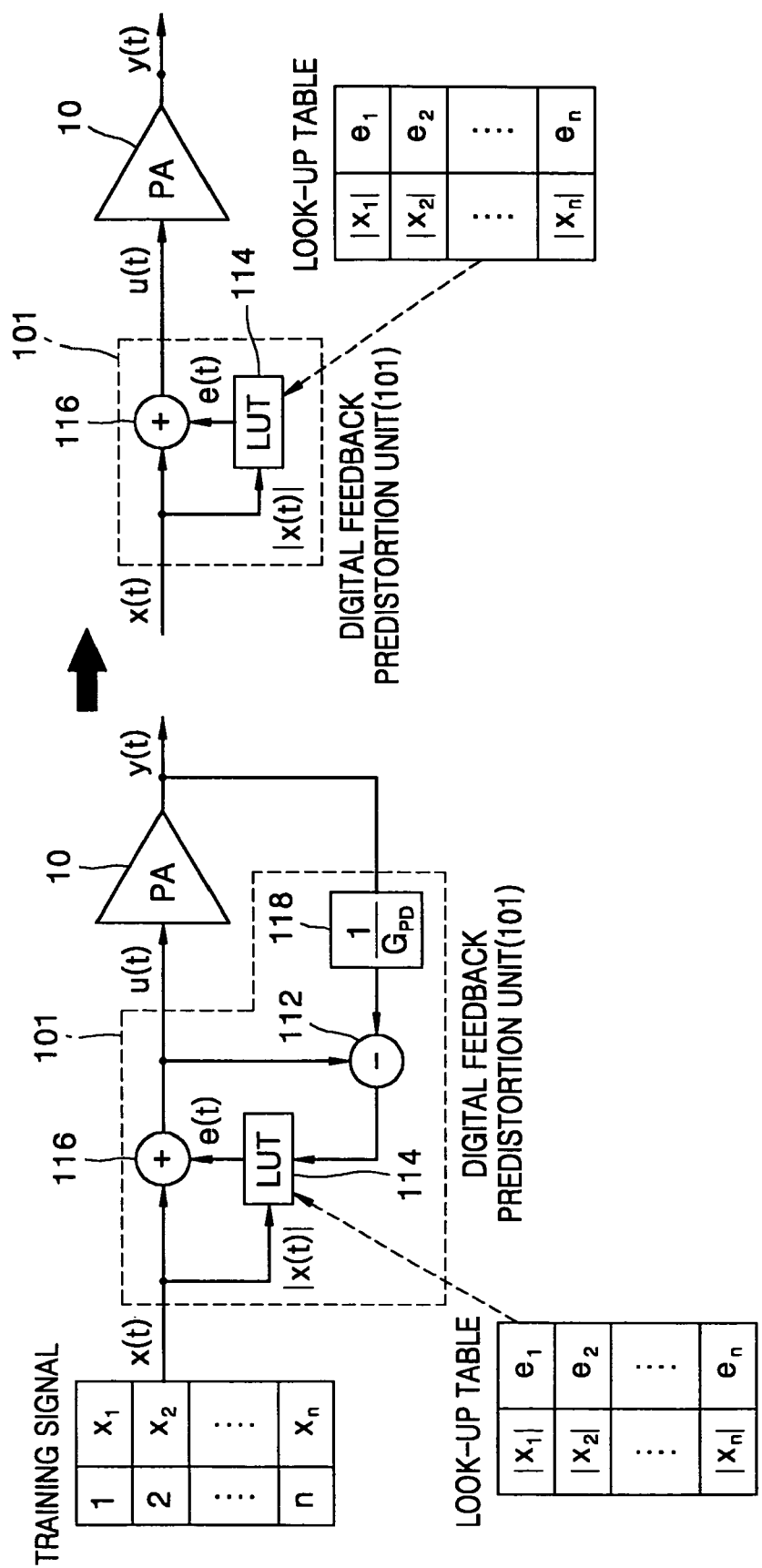
FIG. 6 is a view for explaining the operating principle of the digital feedback linearizing apparatus according to the first embodiment of the present invention.

FIG. 6 is a view for explaining the operating principle of the digital feedback linearizing apparatus 100 according to the first embodiment of the present invention. The operation of the digital feedback linearizing apparatus 100 can be roughly classified into two steps. In the first step, the look-up table 114 is embodied. For example, training signals that gradually increase from 1 to n are input to the input terminal and the look-up table 114 is obtained. The look-up table 114 comprises n feedback signals e(t) that are quantized with respect to the amplitudes of inputs through convergence. In the second step, the PA 10 is linearized. Paths required for obtaining the look-up table 114 are removed and the PA 10 is linearized using the look-up table 114.

The operating principle of the digital feedback linearizing apparatus 200 according to the second embodiment of the present invention shown in FIGS. 4 and 5 is similar to that of the conventional analog feedback predistorter (shown in FIG. 1) except that the feedback reference signal $y_r(t)$ is implemented by the look-up table 214. Equations 2 through 6 below show the operating principle of the digital feedback linearizing apparatus 200 according to the second embodiment of the present invention, in which the feedback reference signal $y_r(t)$ is changed into the look-up table 214 with respect to the amplitudes of inputs by Equation 4. In the following equations, A denotes a gain of the PA 10, d(t) denotes a distortion component caused by the PA 10, and 1/K denotes a degree of offset of the feedback path.

$$y(t) = A \cdot x_e(t) + d(t) \quad (2)$$

$$y_r(t) = \frac{y(t)}{K} \quad (3)$$

$$x_e(t) = x(t) - y_r(t) \quad (4)$$

$$y(t) = \frac{K(Ax(t) + d(t))}{K + A} \quad (5)$$

$$y(t) = Kx(t) + \frac{Kd(t)}{A} \quad (6)$$

In Equation 5, if the digital feedback linearizing apparatus 200 of FIG. 4 is designed such that A>>K, (K+A)≈A is established. As a result, Equation 6 is obtained. As can be seen from Equation 6, the distortion component d(t) is offset by K/A and is linearized. By replacing the feedback reference signal $y_r(t)$ with the look-up table 214, a delay error of the digital feedback linearizing apparatus 200 can be prevented, instability and the narrow operating band of conventional analog feedback predistorters can be fully overcome, and linearization as implied in Equation 6 can be obtained.

Figure 7:
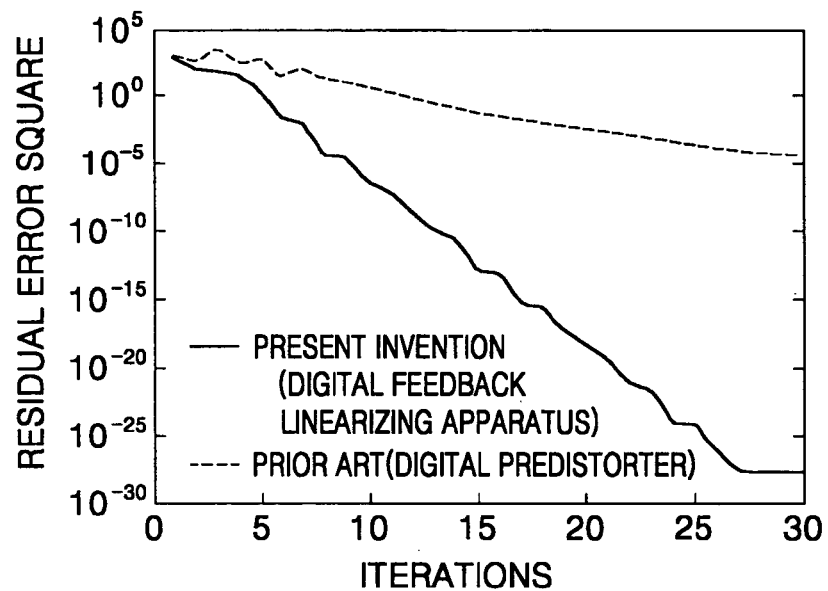
FIG. 7 is a graph showing a comparison between simulation results of convergence speeds of a conventional digital predistorter and a digital feedback linearizing apparatus according to the present invention.

The performance of the digital feedback linearizing apparatus according to the present invention and a conventional digital predistorter will be compared with reference to FIGS. 7 and 8.

FIG. 7 is a graph showing a comparison between simulation results of convergence speeds of the conventional digital predistorter and the digital feedback linearizing apparatus according to the present invention. In FIG. 7, a horizontal axis represents the number of iterations and a vertical axis represents the degree of distortion that remains after linearization of the output signal of the PA 10. It can be clearly seen from FIG. 7 that the digital feedback linearizing apparatus according to the present invention shows convergence characteristics that are much superior to those of the conventional digital predistorter.

Figure 8A:
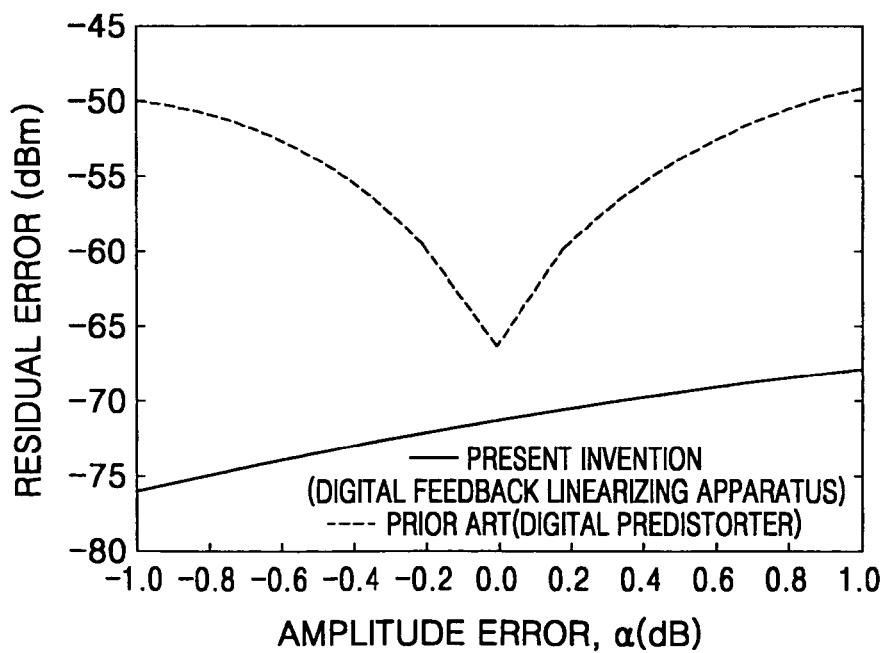
FIGS. 8A and 8B are graphs showing a comparison between simulation results of distortion after linearization of the output signal performed by the conventional digital predistorter and a digital feedback linearizing apparatus according to the present invention.
Figure 8B:
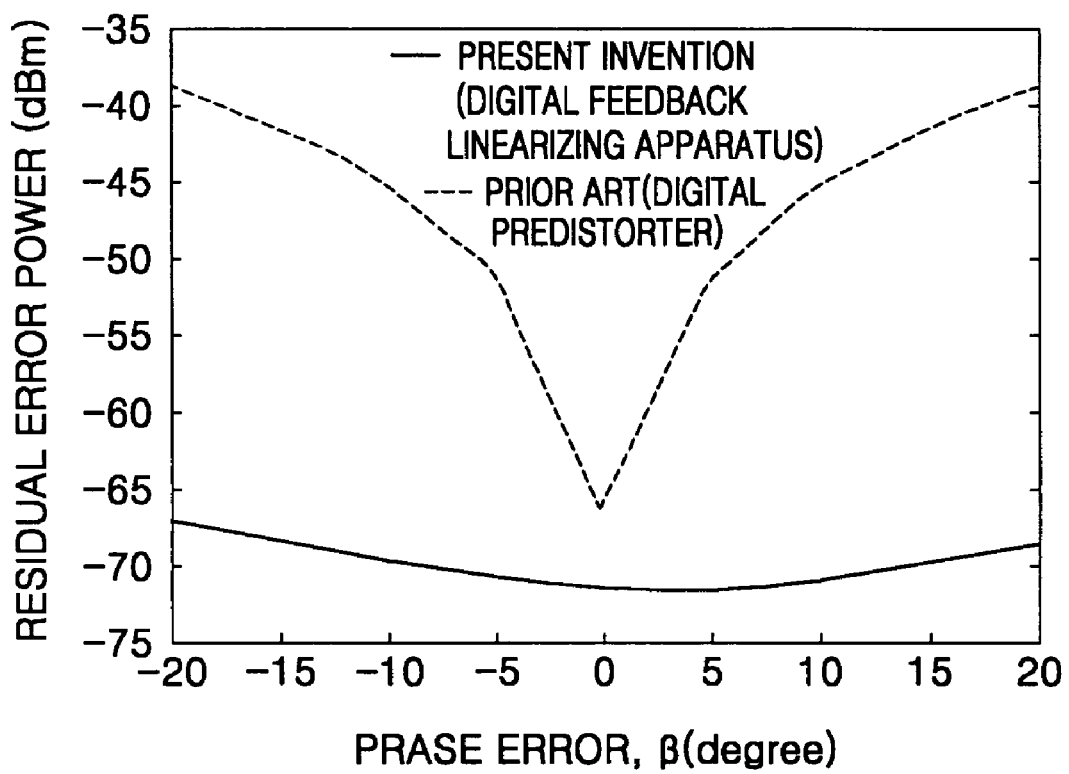

FIG. 8A is a graph showing a comparison between simulation results of the degree of distortion after linearization of the output signal performed by the conventional digital predistorter and the digital feedback linearizing apparatus according to the present invention when an amplitude error occurs in the feedback signal e(t). FIG. 8B is a graph showing a comparison between simulation results of the degree of distortion after linearization of the output signal performed by the conventional digital predistorter and the digital feedback linearizing apparatus according to the present invention when a phase error occurs in the feedback signal e(t). Referring to FIGS. 8A and 8B, the digital feedback linearizing apparatus shows distortion characteristics of much lower levels than that of the conventional digital predistorter in both the amplitude error and the phase error. In this sense, the digital feedback linearizing apparatus according to the present invention has superior distortion offset error allowance.

As can be seen from simulation results of FIGS. 7, 8A, and 8B, the digital feedback linearizing apparatus according to the present invention can complement disadvantages of the conventional analog feedback predistorter and shows characteristics superior to those of the conventional digital predistorter in terms of convergence speed and error allowance. In other words, the digital feedback linearizing apparatus has advantages of both the conventional analog feedback predistorter and digital predistorter.

As described above, the digital feedback linearizing apparatus and method to linearize a PA uses a DSP and a feedback technology, in which a predistorted signal required for linearization is generated by adding an input signal input through a predetermined path to an inverse distortion component corresponding to a distortion component of the PA and in which a linearly amplified output signal is obtained by passing the predistorted signal through the PA, so that linearity of the PA is effectively improved, superior stability and wide operating band can be achieved, and price and size competitiveness can be improved.

While the present invention has been particularly shown and described with reference to exemplary embodiments thereof, it will be understood by those of ordinary skill in the art that various changes in form and details may be made therein without departing from the spirit and scope of the invention as defined by the appended claims and their equivalents.

What is claimed is:

1. A digital feedback linearizing apparatus to linearize a lower amplifier used in a mobile communication base station, the digital feedback linearizing apparatus comprising:
   a power amplifier input/output signal subtracting means, which generates a difference between an input signal and an output signal of the power amplifier;
   an inverse distorted feedback signal extracting means, which extracts an inverse distorted feedback signal (e(t)) corresponding to an input signal (x(t)) input to the digital feedback linearizing apparatus through a predetermined path based on the output signal of the power amplifier input/output signal subtracting means and the input signal (x(t)); and
   a signal adding means, which generates a predistorted signal (u(t)) input to the power amplifier by adding the inverse distorted feedback signal (e(t)) to the input signal (x(t)),
   wherein the power amplifier is linearized using the predistorted signal (u(t)) as an input signal of the power amplifier, and
   wherein the inverse distorted feedback signal extracting means comprises a look-up table composed of signal values that are quantized corresponding to the amplitude of the input signal (x(t)), which gradually increases by a predetermined unit.

2. A digital feedback linearizing apparatus to linearize a power amplifier used in a mobile communication base station, the digital feedback linearizing apparatus comprising:
   a power amplifier input/output signal subtracting means, which generates a difference between an input signal and an output signal of the power amplifier;
   an inverse distorted feedback signal extracting means, which extracts an inverse distorted feedback signal (e(t)) corresponding to an input signal (x(t)) input to the digital feedback linearizing apparatus through a predetermined path based on the output signal of the power amplifier input/output signal subtracting means and the input signal (x(t)); and
   a signal adding means, which generates a predistorted signal (u(t)) input to the power amplifier by adding the inverse distorted feedback signal (e(t)) to the input signal (x(t)), wherein the power amplifier is linearized using the predistorted signal (u(t)) as an input signal of the power amplifier, and wherein the power amplifier input/output signal subtracting means, the inverse distorted feedback signal extracting means, and the signal adding means are included in a digital signal processor.

3. A digital feedback linearizing apparatus to linearize a power amplifier used in a mobile communication base station, the digital feedback linearizing apparatus comprising:

a power amplifier input/output signal subtracting means, which generates a difference between an input signal and an output signal of the power amplifier;

an inverse distorted feedback signal extracting means, which extracts an inverse distorted feedback signal (e(t)) corresponding to an input signal (x(t)) input to the digital feedback linearizing apparatus through a predetermined path based on the output signal of the power amplifier input/output signal subtracting means and the input signal (x(t));

a signal adding means, which generates a predistorted signal (u(t)) input to the power amplifier by adding the inverse distorted feedback signal (e(t)) to the input signal (x(t)); and an output signal offset means that is interposed between an output terminal of the power amplifier and the power amplifier input/output signal subtracting means and controls the amplitude of the output signal of the power amplifier, wherein the power amplifier is linearized using the predistorted signal (u(t)) as an input signal of the power amplifier.

4. The digital feedback linearizing apparatus of claim 3, wherein the output signal offset means offsets the amplitude of the output signal of the power amplifier by the reciprocal of the total gain.

5. A digital feedback linearizing apparatus to linearize a power amplifier used in a mobile communication base station, the digital feedback linearizing apparatus comprising:

a power amplifier input/output signal subtracting means, which generates a difference between an input signal and an output signal of the cower amplifier;

an inverse distorted feedback signal extracting means, which extracts an inverse distorted feedback signal (e(t)) corresponding to an input signal (x(t)) input to the digital feedback linearizing apparatus through a predetermined path based on the output signal of the power amplifier input/output signal subtracting means and the input signal (x(t)); and a signal adding means, which generates a predistorted signal (u(t)) input to the power amplifier by adding the inverse distorted feedback signal (e(t)) to the input signal (x(t)), wherein the power amplifier is linearized using the predistorted signal (u(t)) as an input signal of the power amplifier, and wherein a gain (Gu) when the predistorted signal (u(t)) is fed back and added to the input signal (x(t)) approximates 1.

6. A digital feedback linearizing apparatus to linearize a power amplifier used in a mobile communication base station, the digital feedback linearizing apparatus comprising:

a look-up table composed of signal values that are quantized corresponding to the amplitude of the absolute value of an input signal (x(t)) input to the digital feedback linearizing apparatus;

a feedback output reference signal selecting means, which selects a feedback output reference signal ($y_r(t)$) relating to an output signal fed back from the power amplifier from the look-up table; and a signal adding means, which generates an error signal ($x_e(t)$) input to the power amplifier by adding the feedback output reference signal ($y_r(t)$) to the input signal (x(t)), wherein the power amplifier is linearized using the predistorted signal (u(t)) as an input signal of the power amplifier.

7. The digital feedback linearizing apparatus of claim 6, further comprising an output signal offset means that controls the amplitude of an output signal of the power amplifier and offsets the amplitude of the output signal of the power amplifier by the reciprocal of the total gain of the digital feedback linearizing apparatus.

8. The digital feedback linearizing apparatus of claim 6, wherein when the gain of the power amplifier is A, a distortion component caused by the power amplifier is d(t), a degree of offset caused by feedback is 1/K, and the output signal of the power amplifier is y(t), the following equation is established:

$$y(t) = A \cdot x_e(t) + d(t)$$

$$y_r(t) = \frac{y(t)}{K}$$

$$x_e(t) = x(t) - y_r(t).$$

9. A digital feedback linearizing method implemented by a linearizing apparatus to linearize a power amplifier used in a mobile communication base station, the digital feedback linearizing method comprising:

(a) generating a difference between an input signal and an output signal of the power amplifier;

(b) extracting an inverse distorted feedback signal (e(t)) based on the difference generated in step (a) and an absolute value of an input signal (x(t)) input to the linearizing apparatus through a predetermined path;

(c) generating a predistorted signal (u(t)) input to the power amplifier by adding the inverse distorted feedback signal (e(t)) to the input signal (x(t)); and (d) linearizing the power amplifier using the predistorted signal (u(t)) as an input signal of the power amplifier, wherein step (b) comprises structuring the look-up table composed of signal values that are quantized corresponding to the amplitude of the input signal (x(t)), which gradually increases by a predetermined unit, and extracting the inverse distorted feedback signal (e(t)) from the look-up table.

10. A digital feedback linearizing method implemented by a linearizing apparatus to linearize a power amplifier used in a mobile communication base station, the digital feedback linearizing method comprising:

structuring a look-up table composed of signal values quantized corresponding to the amplitude of an absolute value of an input signal (x(t)) input to the linearizing apparatus;

selecting a feedback output reference signal ($y_r(t)$) relating to an output signal fed back from the power amplifier from the look-up table;

generating an error signal ($x_e(t)$) input to the power amplifier by adding the feedback output reference signal ($y_r(t)$) to the input signal (x(t)); and linearizing the power amplifier by using the error signal ($x_e(t)$) as an input signal of the power amplifier.

* * * * *